United States Patent
Chen et al.

(10) Patent No.: US 10,536,780 B2
(45) Date of Patent: Jan. 14, 2020

(54) PIEZOELECTRIC TRANSDUCER

(71) Applicant: Merry Electronics(Shenzhen) Co., Ltd., ShenZhen (CN)

(72) Inventors: Jen-Yi Chen, Taichung (TW); Chao-Sen Chang, Taichung (TW); Kai-Yu Jiang, Taichung (TW); Jui-Chin Peng, Taichung (TW)

(73) Assignee: Merry Electronics(Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 15/913,938

(22) Filed: Mar. 7, 2018

(65) Prior Publication Data

US 2019/0222940 A1 Jul. 18, 2019

(30) Foreign Application Priority Data

Jan. 15, 2018 (TW) .............................. 107101353 A

(51) Int. Cl.
*H04R 17/00* (2006.01)
*H04R 17/02* (2006.01)
*H01L 41/047* (2006.01)
*H01L 41/113* (2006.01)
*H01L 41/053* (2006.01)

(52) U.S. Cl.
CPC .......... *H04R 17/02* (2013.01); *H01L 41/047* (2013.01); *H01L 41/053* (2013.01); *H01L 41/1132* (2013.01); *H01L 41/1136* (2013.01)

(58) Field of Classification Search
CPC ...... H04R 17/00; H04R 17/005; H04R 17/02; H04R 17/025; H04R 2201/003
See application file for complete search history.

(56) References Cited

U.S. PATENT DOCUMENTS

| | | | | |
|---|---|---|---|---|
| 6,028,389 A | * | 2/2000 | Bernstein | H04R 17/00 310/311 |
| 6,788,796 B1 | * | 9/2004 | Miles | H04R 1/38 381/353 |
| 8,004,154 B2 | * | 8/2011 | Cueff | H01L 41/094 310/324 |
| 9,327,961 B2 | * | 5/2016 | Lemarquand | B81B 3/007 |
| 9,372,111 B2 | * | 6/2016 | Hall | G01H 5/00 |
| 9,516,421 B1 | * | 12/2016 | Loeppert | H04R 17/02 |
| 9,936,298 B2 | * | 4/2018 | Buck | H04R 7/14 |
| 10,170,685 B2 | * | 1/2019 | Grosh | B81B 3/0021 |
| 2018/0098139 A1 | * | 4/2018 | Arevalo Carreno | H04R 31/00 |
| 2018/0234773 A1 | * | 8/2018 | Kaplan | H04R 17/00 |

* cited by examiner

Primary Examiner — Curtis A Kuntz
Assistant Examiner — Ryan Robinson
(74) Attorney, Agent, or Firm — JCIPRNET

(57) ABSTRACT

A piezoelectric transducer including a substrate, a piezoelectric layer and a stiffening structure is provided. The substrate has a chamber. The piezoelectric layer has a displacement zone, a plurality of sensing zones, a plurality of gaps, a plurality of top electrodes, and a plurality of bottom electrodes. The displacement zone is located over the chamber. The sensing zones are surroundingly connected to an outer edge of the displacement zone and are located over the chamber. The gaps are each formed between any adjacent two of the plurality of sensing zones, and each of the gaps communicates with the chamber. The top electrodes are each disposed on a top surface of each of the sensing zones. The bottom electrodes are each disposed on a bottom surface of each of the sensing zones. The stiffening structure is disposed on a bottom of the displacement zone.

14 Claims, 4 Drawing Sheets

PIEZOELECTRIC TRANSDUCER

CROSS-REFERENCE TO RELATED APPLICATION

This application claims the priority benefit of Taiwan application serial no. 107101353, filed on Jan. 15, 2018. The entirety of the above-mentioned patent application is hereby incorporated by reference herein and made a part of this specification.

BACKGROUND

Technical Field

The disclosure relates to a piezoelectric transducer, and particularly relates to a piezoelectric transducer for sensing acoustic waves.

Description of Related Art

A microphone is a transducer that converts sound into electrical signals and includes a variety of forms such as moving coil, capacitive and piezoelectric. The piezoelectric microphone is a piezoelectric transducer made of a piezoelectric material. The piezoelectric material is characterized by the fact that mechanical vibrations acting on the piezoelectric material may be converted into electrical signals, or the voltage applied to the piezoelectric material may be converted into a deformation.

The main structure of the existing piezoelectric transducer is described as follows: a vibrating membrane is fabricated on a substrate by MEMS (microelectromechanical systems) processing, and then a piezoelectric device is disposed on the vibrating membrane. When an external force such as an acoustic wave acts on the vibrating membrane, the pressure of the acoustic wave compresses the vibrating membrane to generate vibrations and deformation. At the same time, the piezoelectric device is driven to be deformed so as to generate a corresponding electrical signal, and the electrical signal is transmitted to an external amplifier or other electronic devices through electrodes.

However, most of the existing vibrating membranes disposed on the piezoelectric transducers are integrally formed structures. When the external force acts on the piezoelectric transducer, the entire vibrating membrane is deformed as the deformation is not concentrated on the piezoelectric device. As a result, the electrical signal read by the piezoelectric device is too weak to achieve high sensitivity. Therefore, regarding the sensing performance of the existing piezoelectric transducer, there is still room for further improvement.

SUMMARY

The disclosure provides a piezoelectric transducer that effectively enhances sensing sensitivity of acoustic waves and balances static pressure inside the transducer.

The piezoelectric transducer of the disclosure includes a substrate, a piezoelectric layer and a stiffening structure. The substrate has a chamber. The piezoelectric layer is disposed on the substrate and has a displacement zone, a plurality of sensing zones, a plurality of gaps, a plurality of top electrodes, and a plurality of bottom electrodes. The displacement zone is located over the chamber. The sensing zones are surroundingly connected to an outer edge of the displacement zone and are located over the chamber. The gaps are each formed between any adjacent two of the plurality of sensing zones, and each of the gaps communicates with the chamber. The top electrodes are each disposed on a top surface of each of the sensing zones. The bottom electrodes are each disposed on a bottom surface of each of the sensing zones. The stiffening structure is disposed on a bottom of the displacement zone. Herein, when an acoustic wave is transmitted to the piezoelectric layer, the displacement zone and the stiffening structure are driven by the acoustic wave to generate a displacement with respect to the substrate, the plurality of sensing zones are deformed to generate an electrical signal, and the plurality of gaps balance a pressure inside the chamber.

In an embodiment of the disclosure, an elastic layer is further included to be disposed between the substrate and the piezoelectric layer and attached to the displacement zone and the plurality of sensing zones. The stiffening structure is formed on the elastic layer and corresponds to the bottom of the displacement zone.

In an embodiment of the disclosure, the elastic layer has a plurality of through-holes, and each of the plurality of through-holes communicates with a corresponding one of the plurality of gaps so that each of the plurality of gaps communicates with the chamber.

In an embodiment of the disclosure, the chamber is rectangular in shape, and a length of each of the plurality of gaps is not greater than one third of a diagonal length of the chamber.

In an embodiment of the disclosure, the chamber is rectangular in shape, and a first area of the displacement zone is in a range of ½ to ⅑ of a second area of the chamber.

In an embodiment of the disclosure, the displacement zone and the stiffening structure are located at a central region of the chamber, and each of the plurality of sensing zones is disposed between an inner edge of the chamber and the outer edge of the displacement zone.

In an embodiment of the disclosure, each of the plurality of sensing zones is a trapezoidal beam increasing in width toward an inner edge of the chamber.

In an embodiment of the disclosure, the plurality of top electrodes and the plurality of bottom electrodes are each a trapezoidal electrode corresponding to each of the plurality of sensing zones.

In an embodiment of the disclosure, an area of each of the plurality of top electrodes is smaller than an area of each of the plurality of bottom electrodes. In an embodiment of the disclosure, the stiffening structure includes a plurality of ribs extending inside the chamber.

In an embodiment of the disclosure, the stiffening structure includes a block extending inside the chamber.

In an embodiment of the disclosure, the chamber, the displacement zone and the stiffening structure are polygonal in shape.

Based on the foregoing, in the disclosure, the piezoelectric layer of the piezoelectric transducer is divided into the displacement zone and the plurality of sensing zones, and the stiffening structure is disposed on the bottom of the displacement zone to strengthen rigidity. When the acoustic wave from the outside acts on the piezoelectric transducer, the displacement zone of the piezoelectric layer generates an up-and-down displacement such that the deformation of the piezoelectric layer is mostly concentrated on the plurality of sensing zones. Accordingly, each of the sensing zones may generate a stronger electrical signal so as to obtain a better sensing sensitivity of acoustic waves. Besides, the gaps between each of the sensing zones may communicate the chamber with the external environment so as to balance the pressure inside the chamber, thereby preventing the generation of erroneous signals due to the change of the outside atmospheric pressure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
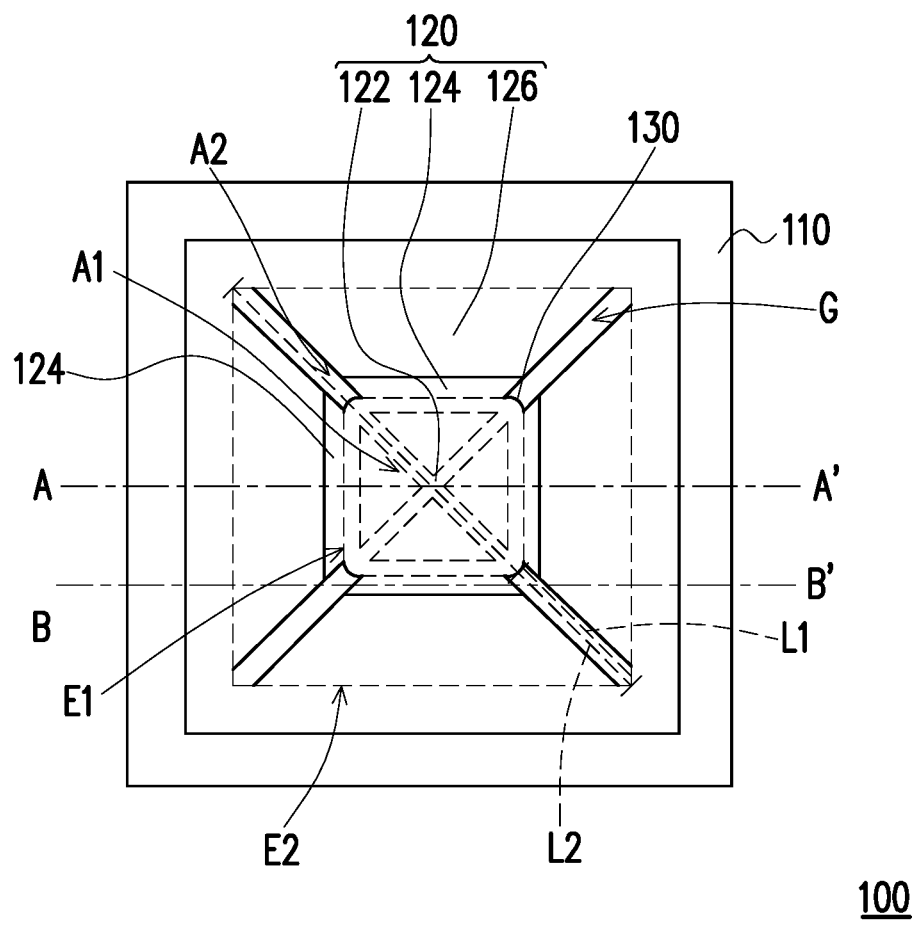
FIG. 1A is a schematic top view of a piezoelectric transducer according to an embodiment of the disclosure.
Figure 1B:
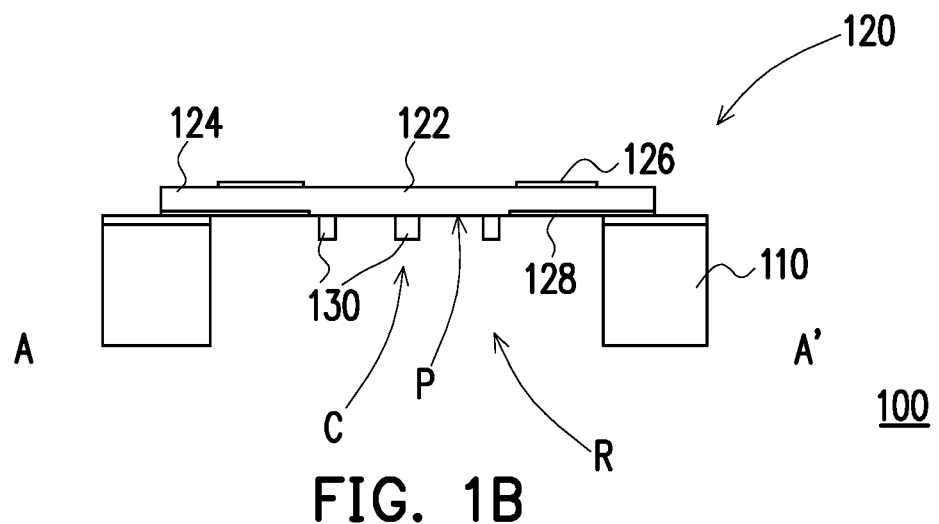
FIG. 1B is a schematic cross-sectional view of the piezoelectric transducer of FIG. 1A taken along the line A-A'.
Figure 1C:
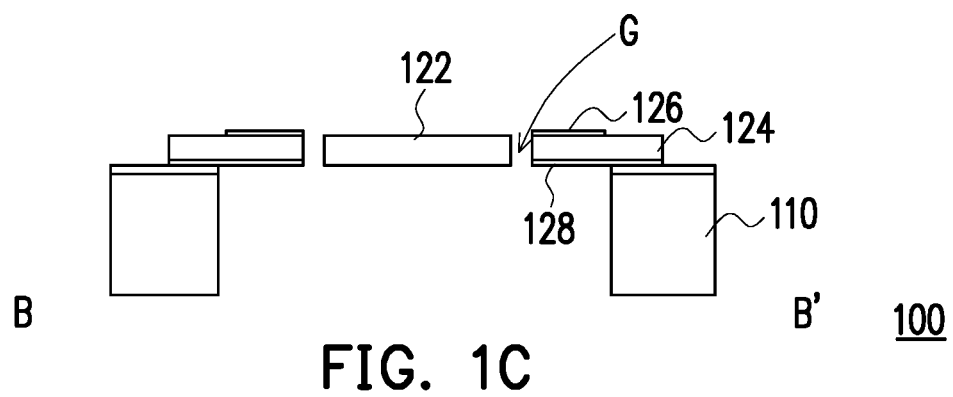
FIG. 1C is a schematic cross-sectional view of the piezoelectric transducer of FIG. 1A taken along the line B-B'.
Figure 1D:
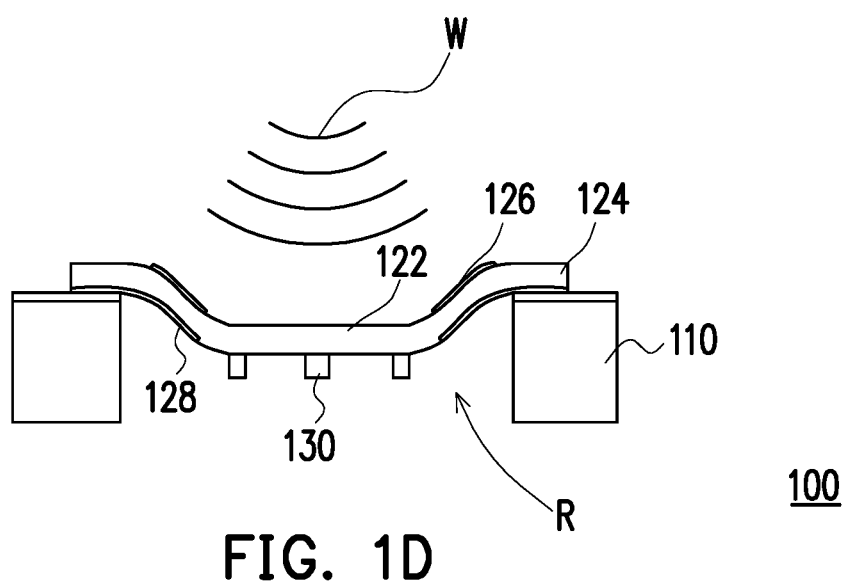
FIG. 1D is a view showing a piezoelectric layer of FIG. 1B in a deformed state, being acted on by an acoustic wave.

FIG. 1A is a schematic top view of a piezoelectric transducer according to an embodiment of the disclosure. FIG. 1B is a schematic cross-sectional view of the piezoelectric transducer of FIG. 1A taken along the line A-A'. FIG. 1C is a schematic cross-sectional view of the piezoelectric transducer of FIG. 1A taken along the line B-B'. FIG. 1D is a view showing a piezoelectric layer of FIG. 1B in a deformed state, being acted on by an acoustic wave.

With reference to FIG. 1A to FIG. 1C, a piezoelectric transducer 100 is adapted to be disposed in an electronic device. The electronic device may be, for example, a cell phone, a tablet computer or other handheld electronic devices, and the piezoelectric transducer 100 may be applied to, for example, a speaker, a microphone or other similar transduction devices.

The piezoelectric transducer 100 includes a substrate 110, a piezoelectric layer 120, and a stiffening structure 130. The substrate 110 is, for example, made of polysilicon, silicon and silicon oxide or other related materials that are mature in semiconductor processing technology. The substrate 110 has a chamber R, which is recessed into the substrate 110. In this embodiment, the chamber R, for example, is formed by performing plasma ion bombardment on a surface of the substrate 110 via dry etching, or is formed by carrying out a chemical reaction between a chemical liquid and the surface of the substrate 110 via wet etching.

The piezoelectric layer 120 is disposed on the substrate 110 and covers the chamber R. In this embodiment, the piezoelectric layer 120, for example, is made of a piezoelectric single crystal material such as quartz, cadmium sulfide (CdS), zinc oxide (ZnO) or aluminum nitride (AlN), a PZT piezoelectric polycrystal material, a piezoelectric polymer, a piezoelectric composite material or other piezoelectric materials, and the disclosure is not limited thereto.

The piezoelectric layer 120 includes a displacement zone 122, a plurality of sensing zones 124, a plurality of gaps G, a plurality of top electrodes 126, and a plurality of bottom electrodes 128. The displacement zone 122 is located over the chamber R of the substrate 110 and is located at a central region C of the chamber R, i.e., an outer edge E1 of the displacement zone 122 is spaced apart from an inner edge E2 of the chamber R. In this embodiment, an outer shape of the displacement zone 122 is approximately rectangular, for example.

The plurality of sensing zones 124 are surroundingly connected to the outer edge E1 of the displacement zone 122 and are located over the chamber R.

Specifically, each of the sensing zones 124 is disposed between the inner edge E2 of the chamber R and the outer edge E1 of the displacement zone 122, such that each of the sensing zones 124 is suspended over the chamber R to form a cantilever beam structure that vibrates and moves with respect to the substrate 110. The plurality of gaps G each penetrate and are formed between any adjacent two of the plurality of sensing zones 124, so that the external environment communicates with the chamber R of the substrate 110 through each gap G.

With reference to FIG. 1A, in this embodiment, the chamber R is for example, rectangular in shape, and a length L1 of each gap G extending from the outer edge E1 of the displacement zone 122 to the inner edge E2 of the chamber R is not greater than one third of a diagonal length L2 of the chamber R. Besides, a first area A1 of the displacement zone 122 is in a range of ½ to ⅑ of a second area A2 of the chamber R. In other embodiments, the length of each gap and the first area of the displacement zone may also be correspondingly adjusted according to actual requirements.

To be more specific, when the first area of the displacement zone R is greater than ½ of the second area of the chamber R, the cantilever beam structure formed by the sensing zone 124 is too short such that a sensing area of the sensing zone 124 is too small. When the sensing zone 124 is affected by an acoustic wave, a deformation of the sensing zone 124 is insufficient as a result, which is not conducive to sensing sensitivity of acoustic waves. When the first area of the displacement zone is smaller than ⅑ of the second area of the chamber R, the length of the gap G is increased and the cantilever beam structure formed by the sensing zone 124 is too long. When the acoustic wave is transmitted to the sensing zone 124, it is easy for the acoustic wave to dissipate through the gap G, which is not conducive to enhancing the sensing bandwidth of the piezoelectric transducer.

To be more specific, each of the sensing zones 124 is a trapezoidal beam increasing in width toward the inner edge E2 of the chamber R. The plurality of top electrodes 126 are each disposed on a top surface of each of the sensing zones 124. The plurality of bottom electrodes 128 are each disposed on a bottom surface of each of the sensing zones 124. Herein the top electrodes 126 and the bottom electrodes 128 are each made of a metal material, for example, and disposed on the sensing zone 124 by vapor deposition, sputtering or other related processes. The top electrodes 126 and the bottom electrodes 128 are each electrically coupled to a corresponding one of the sensing zones 124 and adapted to transmit an electrical signal.

Besides, the top electrodes 126 and the bottom electrodes 128 are each a trapezoidal electrode corresponding to the trapezoidal appearance of each sensing zone 124 so as to make full use of the sensing zone 124. When the sensing zone 124 is deformed by an external force to generate the electrical signal, the electrical signal may be transmitted to an external electronic device by the top electrode 126 and the bottom electrode 128, which is conducive to enhancing the sensing sensitivity. An area of each top electrode 126 is smaller than an area of each bottom electrode 128, which is conducive to reducing the etching problem in package-on-package (POP) processing. In other embodiments, each top electrode and each bottom electrode are, for example, rectangular, round or in other shapes, i.e., the shape of the electrode may be correspondingly adjusted according to actual requirements.

With reference to FIG. 1A and FIG. 1B, the stiffening structure 130 is disposed on a bottom P of the displacement zone 122 and is located at the central region C of the chamber R. In this embodiment, the stiffening structure 130 includes a plurality of ribs formed on the displacement zone 122 by MEMS (microelectromechanical systems) processing, and each of the ribs extends inside the chamber R. Specifically, the plurality of ribs of the stiffening structure 130 are adapted to strengthen the structural rigidity of the displacement zone 122.

With reference to FIG. 1D, when an acoustic wave W is transmitted to the piezoelectric layer 120, the displacement zone 122 and the stiffening structure 130 are driven by the acoustic wave W to generate a displacement with respect to the substrate 110, such as moving toward or away from the chamber R. When the displacement zone 122 and the stiffening structure 130 have a displacement, the plurality of sensing zones 124 are simultaneously driven to be deformed to generate the electrical signal, and the electrical signal may be transmitted to an external amplifier or other electronic devices through each top electrode 126 and each bottom electrode 128 so as to carry out the corresponding signal processing. Since the displacement zone 122 has greater structural rigidity and thus is not deformed easily, the deformation of the piezoelectric layer 120 caused by the acoustic wave W is concentrated on each of the sensing zones 124. In this embodiment, the plurality of gaps G are adapted to balance a pressure inside the chamber R. For example, when the atmospheric pressure is low, the pressure inside the chamber R is greater. At this time, the pressure inside the chamber R may be leaked to the external environment through the plurality of gaps G so that the pressure inside the chamber R and the pressure outside the chamber R tend to be consistent with each other.

In this embodiment, the chamber R, the displacement zone 122 and the stiffening structure 130 are polygonal in shape, for example.

Some other embodiments of the disclosure are provided as follows. It should be noted that the reference numerals and part of the contents of the previous embodiment are used in the following embodiments, in which identical reference numerals indicate identical or similar components, and descriptions of the same technical contents are omitted. Please refer to the description of the previous embodiment for the omitted contents, which will not be repeated hereinafter.

Figure 2A:
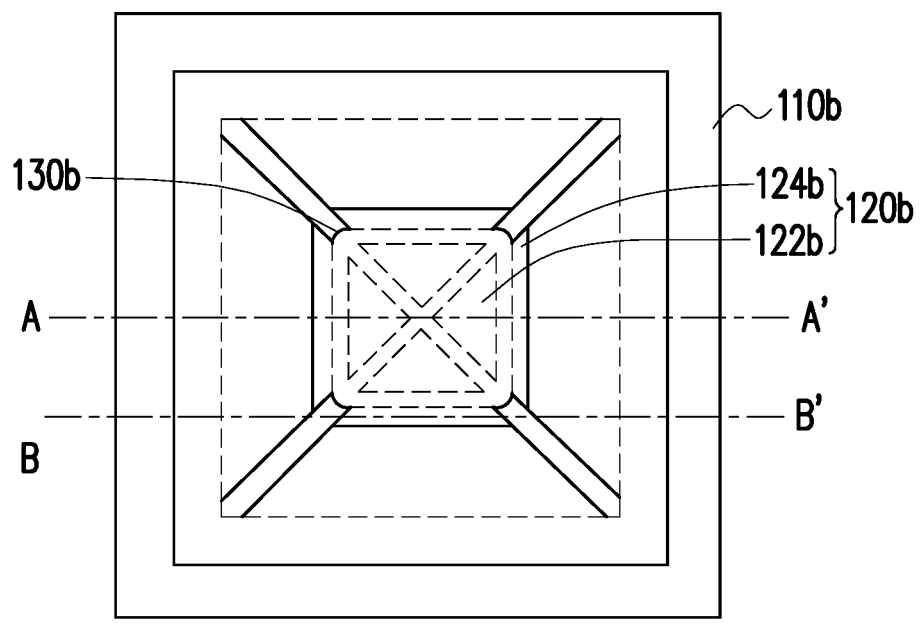
FIG. 2A is a schematic top view of a piezoelectric transducer according to another embodiment of the disclosure.
Figure 2B:
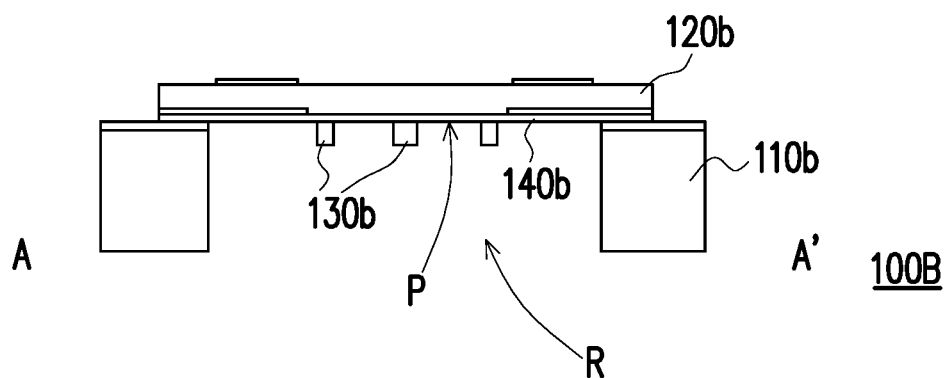
FIG. 2B is a schematic cross-sectional view of the piezoelectric transducer of FIG. 2A taken along the line A-A'.
Figure 2C:
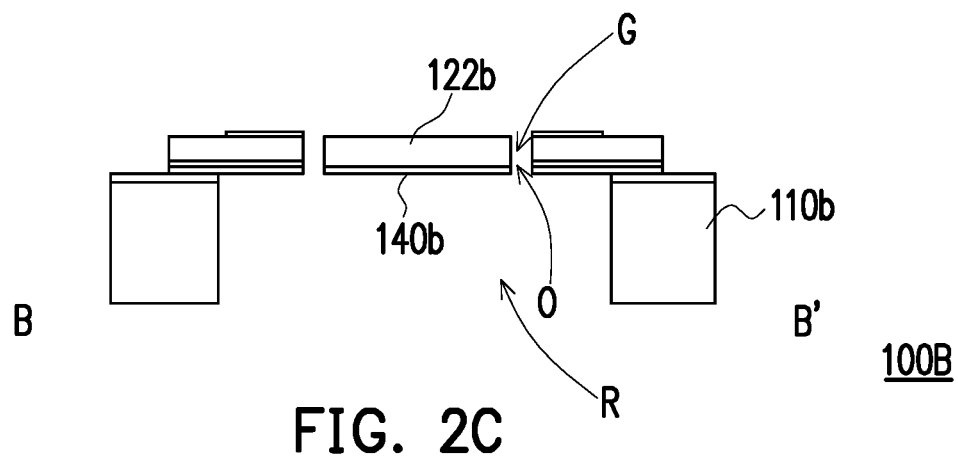
FIG. 2C is a schematic cross-sectional view of the piezoelectric transducer of FIG. 2A taken along the line B-B'.

FIG. 2A is a schematic top view of a piezoelectric transducer according to another embodiment of the disclosure. FIG. 2B is a schematic cross-sectional view of the piezoelectric transducer of FIG. 2A taken along the line A-A'. FIG. 2C is a schematic cross-sectional view of the piezoelectric transducer of FIG. 2A taken along the line B-B'.

With reference to FIGS. 2A to 2C and FIG. 1A, a difference between a piezoelectric transducer 100B of this embodiment and the piezoelectric transducer 100 of the previous embodiment lies in that the piezoelectric transducer 100B includes an elastic layer 140b disposed between a substrate 110b and a piezoelectric layer 120b and attached to a displacement zone 122b and a plurality of sensing zones 124b. Specifically, when the elastic layer 140b is deformed by an acoustic wave, the piezoelectric layer 120b is deformed accordingly. In this embodiment, the elastic layer 140b is, for example, a vibrating membrane structure made of a polysilicon, silicon nitride, metal aluminum or aluminum alloy material or a polymer.

The elastic layer 140b has a plurality of through-holes O, and each of the through-holes O communicates with a corresponding one of a plurality of gaps G so that each of the plurality of gaps G communicates with a chamber R through each of the through-holes O. Specifically, the chamber R achieves pressure balance with the external environment through each of the gaps G and each of the through-holes O, thereby returning the piezoelectric layer 120b to the original position.

A stiffening structure 130b is, for example, a plurality of ribs formed on the elastic layer 140b and corresponds to a bottom P of the displacement zone 122b. As a result, the stiffening structure 130b is adapted to enhance the structural rigidity of the displacement zone 122b.

Figure 3A:
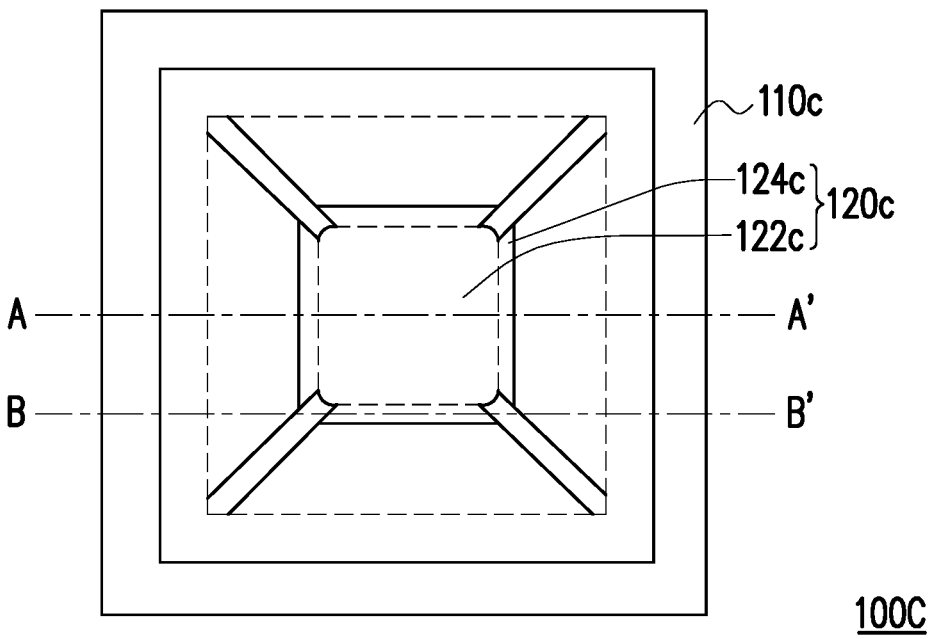
FIG. 3A is a schematic top view of a piezoelectric transducer according to yet another embodiment of the disclosure.
Figure 3B:
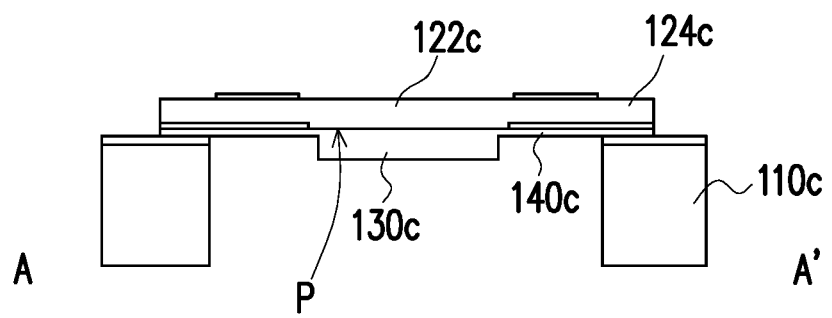
FIG. 3B is a schematic cross-sectional view of the piezoelectric transducer of FIG. 3A taken along the line A-A'.
Figure 3C:
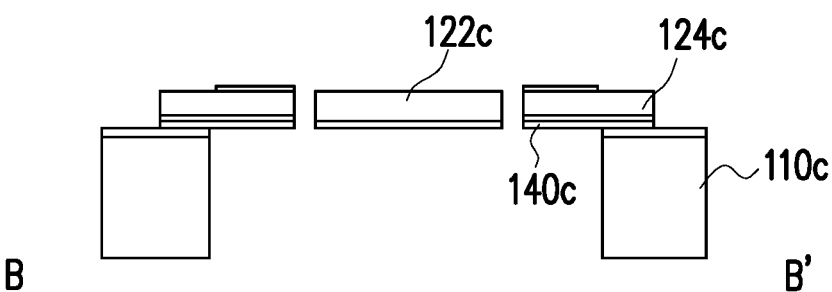
FIG. 3C is a schematic cross-sectional view of the piezoelectric transducer of FIG. 3A taken along the line B-B'.

FIG. 3A is a schematic top view of a piezoelectric transducer according to yet another embodiment of the disclosure. FIG. 3B is a schematic cross-sectional view of the piezoelectric transducer of FIG. 3A taken along the line A-A'. FIG. 3C is a schematic cross-sectional view of the piezoelectric transducer of FIG. 3A taken along the line B-B'.

With reference to FIGS. 3A to 3C and FIG. 2A, a difference between a piezoelectric transducer 100C of this embodiment and the piezoelectric transducer 100B of the previous embodiment lies in that a stiffening structure 130c of the piezoelectric transducer 100C is, for example, a block formed on an elastic layer 140c and extending inside a chamber R, and the elastic layer 140c is disposed between a substrate 110c and a piezoelectric layer 120c. The stiffening structure 130c corresponds to a bottom P of a displacement zone 122c. Since the stiffening structure 130c is a solid block formed on the elastic layer 140c, the stiffening structure 130c as shown in FIG. 3A has greater structural rigidity than the stiffening structure 130b as shown in FIG. 2A.

In summary, in the embodiments of the disclosure, the piezoelectric layer of the piezoelectric transducer is divided into the displacement zone and the plurality of sensing zones, and the stiffening structure is disposed on the bottom of the displacement zone to strengthen rigidity. When the acoustic wave from the outside acts on the piezoelectric transducer, the displacement zone of the piezoelectric layer only generates an up-and-down displacement such that the deformation of the piezoelectric layer is mostly concentrated on the plurality of sensing zones. Accordingly, each of the sensing zones may generate a stronger electrical signal so as to obtain a better sensing sensitivity of acoustic waves. Besides, the gaps between each of the sensing zones may communicate the chamber with the external environment so as to balance the pressure inside the chamber and keep the piezoelectric layer in the initial position for the subsequent sensing process, thereby preventing the generation of erroneous signals due to the change of the outside atmospheric pressure. In another embodiment, the elastic layer is adopted to absorb a part of the external force acting on the piezoelectric layer, thereby preventing the piezoelectric layer from being damaged due to excessive deformation.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A piezoelectric transducer, comprising:
    a substrate having a chamber;
    a piezoelectric layer disposed on the substrate and comprising:
        a displacement zone located over the chamber;
        a plurality of sensing zones surroundingly connected to an outer edge of the displacement zone and located over the chamber;
        a plurality of gaps each formed between any adjacent two of the plurality of sensing zones, wherein each of the plurality of gaps communicates with the chamber;
        a plurality of top electrodes each disposed on a top surface of each of the plurality of sensing zones; and
        a plurality of bottom electrodes each disposed on a bottom surface of each of the plurality of sensing zones; and
    a stiffening structure disposed on a bottom of the displacement zone, so that the structural rigidity of the displacement zone is greater than the structural rigidity of the sensing zone,
    wherein when an acoustic wave is transmitted to the piezoelectric layer, the displacement zone and the stiffening structure are driven by the acoustic wave to generate a displacement with respect to the substrate, the plurality of sensing zones are deformed to generate an electrical signal.

2. The piezoelectric transducer as recited in claim 1, further comprising an elastic layer disposed between the substrate and the piezoelectric layer and attached to the displacement zone and the plurality of sensing zones, wherein the stiffening structure is formed on the elastic layer and corresponds to the bottom of the displacement zone.

3. The piezoelectric transducer as recited in claim 2, wherein the elastic layer has a plurality of through-holes, wherein each of the plurality of through-holes communicates with a corresponding one of the plurality of gaps so that each of the plurality of gaps communicates with the chamber.

4. The piezoelectric transducer as recited in claim 1, wherein the chamber is rectangular in shape, and a length of each of the plurality of gaps is not greater than one third of a diagonal length of the chamber.

5. The piezoelectric transducer as recited in claim 1, wherein the chamber is rectangular n shape, and a first area of the displacement zone is in a range of ½ to ⅑ of a second area of the chamber.

6. The piezoelectric transducer as recited in claim 1, wherein the displacement zone and the stiffening structure are located at a central region of the chamber, and each of the plurality of sensing zones is disposed between an inner edge of the chamber and the outer edge of the displacement zone.

7. The piezoelectric transducer as recited in claim 6, wherein each of the plurality of sensing zones is a trapezoidal beam increasing in width toward an inner edge of the chamber.

8. The piezoelectric transducer as recited in claim 7, wherein the plurality of top electrodes and the plurality of bottom electrodes are each a trapezoidal electrode corresponding to each of the plurality of sensing zones.

9. The piezoelectric transducer as recited in claim 1, wherein an area of each of the plurality of top electrodes is smaller than an area of each of the plurality of bottom electrodes.

10. The piezoelectric transducer as recited in claim 1, wherein the stiffening structure comprises a plurality of ribs extending inside the chamber.

11. The piezoelectric transducer as recited in claim 2, wherein the stiffening structure comprises a plurality of ribs extending inside the chamber.

12. The piezoelectric transducer as recited in claim 1, wherein the stiffening structure comprises a block extending inside the chamber.

13. The piezoelectric transducer as recited in claim 2, wherein the stiffening structure comprises a block extending inside the chamber.

14. The piezoelectric transducer as recited in claim 1, wherein the chamber, the displacement zone and the stiffening structure are polygonal in shape.

* * * * *